United States Patent
Kobayashi et al.

(10) Patent No.: US 8,938,042 B2
(45) Date of Patent: Jan. 20, 2015

(54) AUTOMATICALLY SYNCHRONIZING RING OSCILLATOR FREQUENCY OF A RECEIVER

(75) Inventors: Osamu Kobayashi, Los Altos, CA (US); Gyo Un Choi, Cupertino, CA (US)

(73) Assignee: STMicroelectronics, Inc., Carollton, TX (US)

( * ) Notice: Subject to any disclaimer, the term of this patent is extended or adjusted under 35 U.S.C. 154(b) by 557 days.

(21) Appl. No.: 12/711,561

(22) Filed: Feb. 24, 2010

(65) Prior Publication Data
US 2010/0303187 A1    Dec. 2, 2010

Related U.S. Application Data

(60) Provisional application No. 61/181,563, filed on May 27, 2009.

(51) Int. Cl.
| | |
|---|---|
| *H03D 3/24* | (2006.01) |
| *H03L 7/08* | (2006.01) |
| *H03L 7/099* | (2006.01) |
| *H03L 7/10* | (2006.01) |

(Continued)

(52) U.S. Cl.
CPC ............ *H03L 7/0807* (2013.01); *H03L 7/0995* (2013.01); *H03L 7/10* (2013.01); *H04L 7/0012* (2013.01); *H04L 7/033* (2013.01); *H03L 7/095* (2013.01)
USPC .......................................... 375/376

(58) Field of Classification Search
CPC ....... H03L 7/0807; H03L 7/10; H03L 7/0995; H03L 7/095; H04L 7/0012; H04L 7/033
USPC .......... 375/354, 371, 373, 375, 376; 327/141, 327/144, 146, 147, 149, 155, 156, 158; 331/57
See application file for complete search history.

(56) References Cited

U.S. PATENT DOCUMENTS

| | | | | |
|---|---|---|---|---|
| 5,272,730 | A  * | 12/1993 | Clark | ............................. 375/376 |
| 2005/0025053 | A1* | 2/2005 | Izzat et al. | ..................... 370/231 |

(Continued)

FOREIGN PATENT DOCUMENTS

JP    2001-230750    8/2001

OTHER PUBLICATIONS

European Search Report dated Aug. 27, 2010 in EP Application No. 10158044.7.

(Continued)

*Primary Examiner* — Vineeta Panwalkar
(74) *Attorney, Agent, or Firm* — Seed IP Law Group PLLC (57) ABSTRACT

A ring oscillator in a receiver in a multimedia network is adjusted to compensate for factors that may decrease its accuracy over time using a link training signal from a transmitter device in the network. An incoming signal having a known frequency is received at a receiver or sink device from a transmitter, the signal may be a link training signal used for configuring a link between the two devices. In the receiver, an internally generated clock signal is created, the signal having an internal frequency. The incoming signal and the internally generated clock signal are input into a frequency detector which outputs frequency comparison-based data. The internal frequency is based on the comparison-based data such that it is adjusted to be closer to the known frequency of the incoming signal.

13 Claims, 8 Drawing Sheets

(51) Int. Cl.
*H04L 7/00* (2006.01)
*H04L 7/033* (2006.01)
*H03L 7/095* (2006.01)

(56) References Cited

U.S. PATENT DOCUMENTS

2007/0153129 A1    7/2007  Kawamoto et al.
2007/0286320 A1*  12/2007  Jiang .............................. 375/371
2008/0001677 A1*   1/2008  Shaked et al. .................. 331/44
2009/0296869 A1*  12/2009  Chao et al. .................... 375/376

OTHER PUBLICATIONS

EPO Examination Report dated Aug. 3, 2012.
"Serial Attached SCSI Phy Layer," by Rob Elliott, HP Industry Standard Servers, Server Storage Advanced Technology; Sep. 30, 2003; pp. 1-46.

* cited by examiner

AUTOMATICALLY SYNCHRONIZING RING OSCILLATOR FREQUENCY OF A RECEIVER

CROSS-REFERENCE TO RELATED APPLICATIONS

This application claims priority under 35 U.S.C. §119(e) to Provisional Patent Application No. 61/181,563, filed May 27, 2009 entitled "Automatically Synchronizing Frequencies of a Video Display and a Video Source", which is incorporated by reference herein in its entirety.

TECHNICAL FIELD

The present invention relates generally to communication of various types of data in a multimedia network. More specifically, it relates to improving the frequency of a ring oscillator clock in a receiver using link training data from a transmitter.

BACKGROUND OF THE INVENTION

Currently, multimedia networks are relatively uncomplicated in their handling of "hot plug" events. In general, a "hot plug" event is a situation where an active device is plugged into an already active system. This can mean providing a powered-on device and plugging it into a network device that is also powered on or operating (typically using some sort of communication link). Also, it can mean providing a network of connected device with a first device in a power-on state and then powering up an already connected device. Such hot plugging describes changing or adding components which interact with an operating system or active device. Ideally, this should occur without significant interruption to the system. Moreover, such hot plugging should enable the changing or adding of components a network device (in one example, a computer or a monitor) while it is operating.

In existing devices, such hot plug events flow somewhat seamlessly when a device's operating system is fully booted up and operational. However, difficulties begin to arise when a "hot plug" event or an unplug/re-plug event occurs before the device operating system is fully booted up and operational. In such conditions, the interrupt handing mechanisms of many systems and devices are unable to cope with the events. In some cases, unanticipated interrupt events may disrupt systems ill suited to accommodate such events. Moreover, such interrupt handling can cause serious system incompatibility issues between the various components and systems of the device and its peripheral systems. Furthermore, when applied to an audio-video network, and when a display is hot plugged into a source device, for a period of time after the hot plug event, there can be a significant period of time in which the display cannot display any valid video or other type of data. This can be problematic in conditions where video data, a visual display, for example, is required to obtain further user input (e.g., "Press F8 for modifying BIOS"), as well a presenting a general inconvenience. Under these circumstances there is an increasing need for methods and systems capable of displaying video data in a number of hot plug situations that are not addressed in current network devices and systems.

While existing systems and methods work well for many applications, there is an increasing demand for display methodologies, systems, and integrated circuits that enable the display of audio-video data in a wider range of operational circumstances and with greater capacity to enjoy the benefits of modern multimedia equipment, software and devices. For these goals to be met, it is desirable to be able to maintain a reliable and stable clock in the receiver while minimizing computational resources and memory needed for doing so.

SUMMARY OF THE INVENTION

In one aspect of the invention, a method of adjusting a ring oscillator in a receiving using a link training signal to compensate for factors that may cause the oscillator to be less accurate over time is described. An incoming signal having a known frequency is received at a receiver or sink device from a transmitter. In one embodiment, the incoming signal is a link training signal. In the receiver, an internally generated clock signal is created, the signal having an internal frequency. The incoming signal and the internally generated clock signal are input into a frequency detector which outputs frequency comparison-based data. The internal frequency is based on the comparison-based data such that it is adjusted to be closer to the known frequency of the incoming signal.

In one embodiment, the internally generated clock signal is generated by inputting a target signal having a target frequency of the ring oscillator into a phase-locked loop (PLL) module. The frequency detector output signal is input into the PPL creating an adjusted internal signal. In another embodiment, it is determined whether the internal frequency of the internal generated clock signal is within a threshold difference of the known frequency of the incoming signal. In another embodiment, the internal frequency is adjusted if the known frequency is outside a threshold frequency difference with respect to the internal frequency. In another embodiment, a request is communicated to a source device to adjust the bit rate of the incoming signal, the request being created based on frequency detector output.

In another aspect of the present invention, an integrated circuit device for adjusting the frequency of a ring oscillator is described. The device has a frequency detection circuitry that accepts a link training signal and an internally generated clock signal as input. The detection circuitry compares the training signal with the clock signal. The integrated circuit device also contains frequency circuitry for trimming the internally generated clock signal based on an output from the frequency detection circuitry. A ring oscillator on the IC device generates a signal having a target frequency. Phase-locked loop circuitry receives instructions from the frequency calibration circuitry and performs operations on the target frequency, thereby creating the internally generated clock signal.

In one embodiment, the IC device also contains a request generation module for creating a request to a transmitter to adjust the link training signal. The frequency detection circuitry may contain signal comparison circuitry for determining whether a frequency difference between the link training signal and the internally generated clock signal is greater than a specific threshold difference. In another embodiment the PLL circuitry generates an internally generated clock signal by performing operations on the target frequency from the ring oscillator.

General aspects of the invention include, but are not limited to methods, systems, apparatus, and computer-readable media for enabling message transmission in multimedia device networks.

BRIEF DESCRIPTION OF THE DRAWINGS

The invention and the advantages thereof may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

Reference is made to particular embodiments of the invention. One example of which is illustrated in the accompanying drawings. While the invention will be described in conjunction with the particular embodiment, it will be understood that it is not intended to limit the invention to the described embodiment. To the contrary, it is intended to cover alternatives, modifications, and equivalents as may be included within the spirit and scope of the invention as defined by the appended claims.

Aspects of the invention pertain to methods and systems for adjusting the frequency of a ring oscillator using link training data thereby leveraging the training data to obtain a reliable and steady clock.

Figure 1:
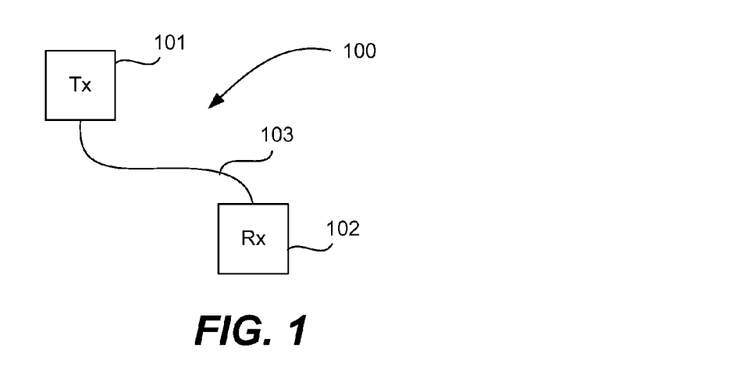
FIG. 1 illustrates a simplified network embodiment of a multi-media network in accordance with the principles of the invention.

In ordinary operation of multimedia systems a number of sink devices, source devices, as well as other network devices (routers, splitters, etc.) are linked together in a multimedia network. FIG. 1 illustrates a highly simplified example multimedia network 100 comprising a source device 101 and a sink device 102 linked by a data link 103.

Example source devices 101 include, but are not limited to any device capable of producing or transmitting multimedia signal. In embodiments of this invention the signal comprises multimedia data that shall be interpreted broadly. Moreover, throughout the specification and claims multimedia and audio-video signal shall be used interchangeably and have the same meaning. Accordingly, such multi-media content can include, but is not limited to, video, still images, animation, text, audio (sound, music, etc.) and interactive content, as well as combinations of all of the foregoing.

Again, in general, source devices 101 are those devices that capture, generate, or transmit multimedia content. Particular source devices 101 include, but are not limited to set top boxes, DVD players, cameras, video recorders, game platforms, computers, HD video devices, VCR devices, radio, satellite boxes, music players, content capture and content generation devices, and many other such source devices beyond those referenced above.

The network 100 can further include one or more sink devices 102. As used herein, example sink devices 102 can comprise any device capable of receiving and/or consuming multi-media content. For example, particular embodiments can include, but are not limited to, audio devices, display devices, stereo equipment, receivers, game devices, and many other such audio-video sink devices.

Other network devices applicable to this invention include, but are not limited to multimedia hubs, splitters, concentrators, switchable devices with many inputs and fewer outputs, replicators, concentrators, and many other types of branch devices that can link various combinations of components together. These branch devices modernly are mixed with standard sink/source capabilities and so are well suited to applications of this invention. It should be noted that many devices combine traditional source and sink functionalities, and also such network devices can include a wide range of devices combining other of these functions.

During operation of the networked systems it may at some time become necessary or desirable to "hot plug" various components. As used here "hot plugging" describes changing or adding components which interact with another network device in a power on configuration. In general, "hot plugging" is the act of connecting a powered device into another network device or the act of powering on a connected device. In one example, a powered second device is plugged into another device (first device). As just indicated, hot plugging also describes an event where the second and first devices are already connected (using for example, a data link) and then the second device is switched on. The "hot plug" being the switch on event. For reasons described later, these events are made more important if the first device is in the power on state during the event.

Additionally, hot plug events include unplugging a device and then re-plugging it (hot plugging being the re-plugging event). For example, when a sink device 102 (for example, a display device) is connected to an operating source device 101 (a computer or DVD or other such device) a hot plug event occurs.

Accordingly, the actual hot plug event occurs when the second device is both connected and in a power on state. Under most operating conditions such hot plug events are commonplace and somewhat unremarkable as the operating system of the device 101 is configured to anticipate and handle such events. However, in certain circumstances such hot swap or hot plug events can prove troublesome.

Figure 2A:
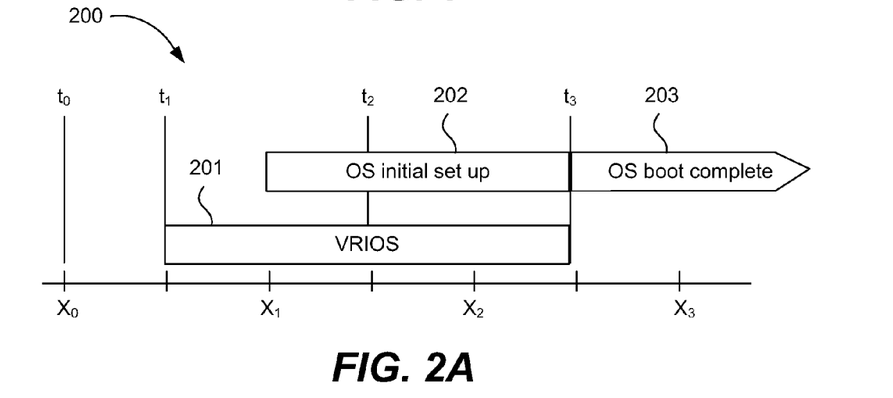
FIG. 2A illustrates a timing diagram useful for illustrating problems and solutions in accordance with the principles of the invention.

FIG. 2A is a timing diagram 200 that illustrates, in a very general way, a start up cycle for an example electronic device (e.g., 101) and the effects of various hot plug events. This representative example uses a network 100 such as that of FIG. 1. In this example, the device 101 (source) will comprise a computer device and device 102 (sink) will comprise a display device. For purposes of illustration four different time markers ($t_0$, $t_1$, $t_2$, $t_3$) are illustrated. Time $t_0$ is an arbitrary time used in an explanatory discussion of a start up process for device 101. At $t_1$ the device 101 is powered on. Subsequently the Video Basic Input/Output System (VBIOS) of device 101 initiates operation 201. At $t_2$ the main operating system (e.g., LINUX®, Windows®, Darwin®, and many others) of the device 101 begins a boot up process 202. At $t_3$ the main operating system is fully booted up 203 and begins operation. As such, after $t_3$ the main operating system takes over operation of the device 101.

Figure 2B:
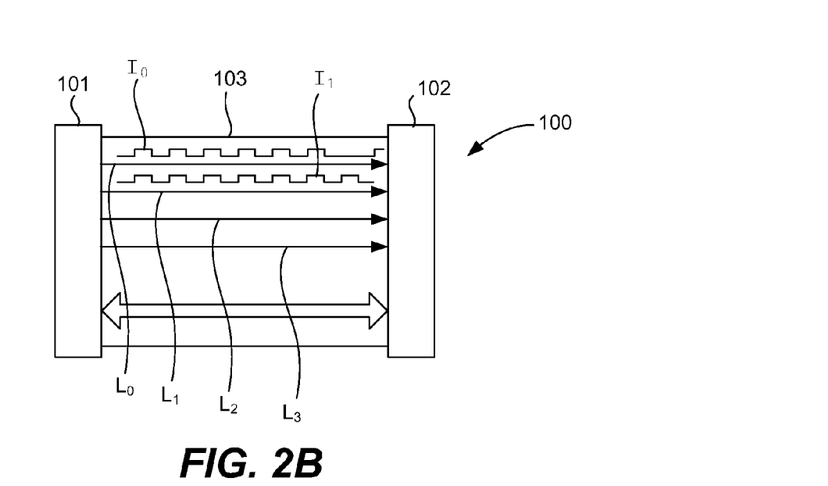
FIG. 2B illustrates a simplified network embodiment of a multi-media network transmitting an audio-video signal in data channels of a data link.

Additionally, FIG. 2B illustrates a number of power on or hot plug "events" ($x_0$, $x_1$, $x_2$, $x_3$). The events ($x_0$, . . . , $x_3$) each identify a moment of a hot plug event for device 102 (i.e., the moment device 102 is both connected with device 101 and in a power on state).

To explain, in this example, at $t_0$, the device 102 is connected with the device 101 and is powered on at $x_0$. Thus, the hot plug event $x_0$ occurs prior to the powering on of the source device 101 at $t_1$. This is a common default state and when the device 101 is powered up the VBIOS 201 of the device 101 recognizes the connected and powered sink device 102. Accordingly, at $t_1$ the VBIOS of the source device initiates the standard start up and initiation protocols enabling data to be transmitted to the sink 102. During a typical start up routine the VBIOS operates the drivers and systems enabling correct operation of the sink 102 until the operating system fully boots up 203 and begins to manage the device 101 operation (and the sink 102). Ordinarily, the VBIOS is capable of operating and interacting with the sink device 102 and performing the necessary configuration prior to operating system boot without complication.

At $t_2$ the operating system begins to boot up 201 and the VBIOS is still handling the majority of system interrupts and system calls. This boot up beginning period 202 is also discussed herein as a "dark period" where the operating system is not fully able to operate the device 101. After the dark period, at time $t_3$, the operating system is fully booted up 203 and the ordinary operation of the operating system occurs.

Referring again to FIG. 2A, events $x_1$, $x_2$, $x_3$, are briefly described. The event $x_3$ describes a hot plug event occurring after the operating system has become fully active or is operating in a safe mode. During this period, after a hot plug event $x_3$, the source 101 will receive a hot plug detect message (HPD) sent by the sink 102 upon connection. During the operation of the operating system (203) the operating system receives the HPD message and acknowledges that it has received the HPD. Thereafter the source transmits link training information along with associated audio-video signal. This enables the sink to initiate a link training protocol that enables the sink 102 to reconstruct the data streams sent from the source 101 through the data link 103. The process of link training will be described elsewhere in this application. The methods and systems required to do such link training are disclosed in other patents and will not be described in detail here.

With reference to FIG. 2A, events $x_1$ & $x_2$ are briefly explained. The event $x_1$ describes a hot plug event that occurs after the activation of the VBIOS 201 after source 101 power on ($t_1$). The operating system has not become active at this point. As indicated above, the VBIOS system works reasonable well when the sink is powered on and is connected prior to the start of the VBIOS (i.e., before $t_1$ for example at time $t_0$). The VBIOS operates the sink 102 with VBIOS drivers and configuration systems. However, if a hot plug event occurs after the initiation of the VBIOS the VBIOS interrupt handling systems are not suitable for enabling effective configuration of the source device to handle the newly hot plugged sink device. In particular the VBIOS system is not capable of responding to the HPD message received from the sink and cannot initiate or operate link training. Moreover, the VBIOS interrupt handling may result in a wide array of system incompatibility problems that can yield unpredictable and undesirable results. Significantly, this situation will prevent the display of an audio-video signal sent by source 101 to display 102.

As stated above, in response to hot plug event $x_1$, and during the initial operation of VBIOS 201, the source 101 will receive a hot plug detect message (HPD) sent by the sink 102. However, during this period (201) the VBIOS receiving the HPD cannot recognize the HPD message sent by the sink. Moreover, it cannot respond to link state changes in the link 103 (such as occur during a hot plug event). Accordingly, during period 201 the source cannot provide link training information to the sink device. Absent this information, the sink cannot be configured to properly display the content at the sink 102. This is a shortcoming in the present state of the art.

With further reference to FIG. 2A, event $x_2$ is briefly explained. The event $x_2$ describes a hot plug event that occurs after the start up (at $t_2$) of the operating system (202) but before it becomes fully operational (the dark period). Thus, as with event $x_1$, the operating system has not become active at this point. As indicated previously, this interrupt is still handled by the VBIOS system and suffers from the same limitations. In particular, the VBIOS interrupt handling systems are not suitable for enabling effective link training, responding to the HPD message, and cannot sense state changes in the link 103. As before, this situation will prevent the display of video signal sent by source 101 to display 102 because the sink has not received configuration information from the source (indeed, the source does not even know to send the information) and cannot be configured. Accordingly, during dark period 202, after a hot plug event $x_2$, the source 101 will receive a hot plug detect message (HPD) sent by the sink 102. However, during this dark period 202 the VBIOS receives the HPD and cannot recognize the HPD messages sent by the sink. Accordingly, as described before, link training information will not be provided to the sink and the data cannot be properly displayed at the sink 102.

A more detailed description of the way the embodiments of the invention overcome these present limitations are explained below in greater detail in accord with FIGS. 5-8. A brief description of a communication protocol and link configuration is helpful prior to a fuller discussion of hot plug management.

Figure 3:
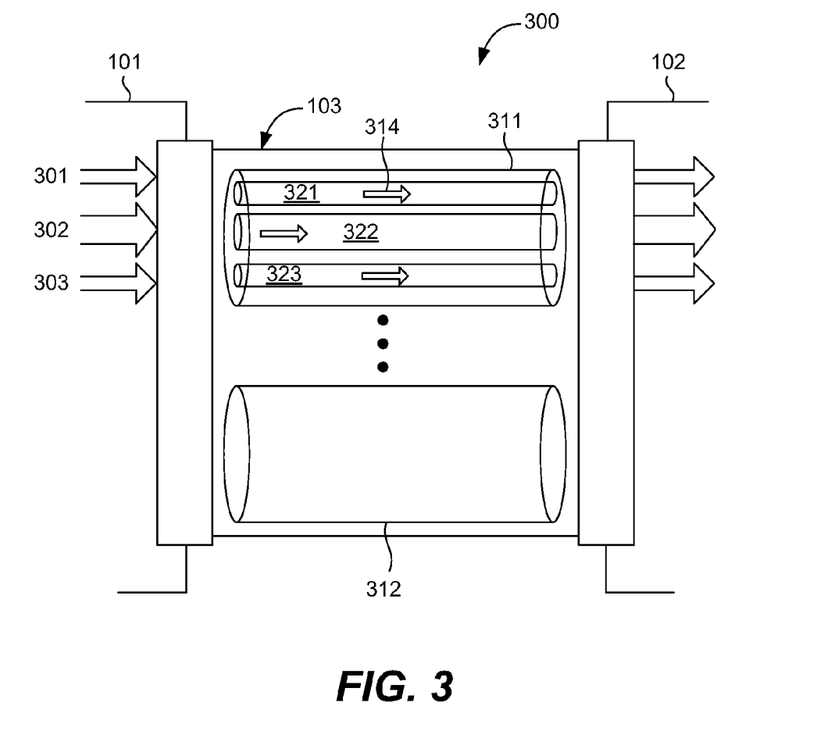
FIG. 3 illustrates an example link embodiment suitable for use in the networks described herein.

For example, FIG. 3 shows a generalized representation of a cross platform packet based digital video data transmission system 300 in accordance with an embodiment of the invention. The system uses a data link 103 to connect a transmitter 101 to a receiver 102. The data link 103 can include a plurality of separate uni-directional physical data channels 311, 312. Typically, the number of channels is 1, 2, or 4 but is not limited to such. In the described embodiment, a number of data streams 301-303 are received or generated at the transmitter 101. If needed the transmitter 101 packetizes each the data steams into a number of data packets 314. These data packets are then formed into corresponding data streams and each of the data streams are introduced into the data channel 311. In this embodiment, each data stream is passed into the associated data channels by way of an associated virtual pipe 321-323 to the receiver 102. It should be noted that the link rate (i.e., the data packet transfer rate) for each virtual link can be optimized for the particular data stream resulting in data streams each having an associated link rate (each of which could be different from each other depending upon the particular data stream). The data streams can take any number of forms such as video, graphic, audio, etc. The aggregate data rates of the virtual pipes 321-323 can define a link rate for the channel 311.

Typically, when the source is a video source, the data streams 301-303 include various video signals that can have any number and type of well-known formats, such as composite video, serial digital, parallel digital, RGB, or consumer digital video. The video signal can be an analog video signal which is converted to a digital format for transmission.

The digital video signal can be any number and type of well known digital formats such as, SMPTE 274M-1995 (1920× 1080 resolution, progressive or interlaced scan), SMPTE 296M-1997 (1280×720 resolution, progressive scan), as well as standard 480 progressive scan video, and many others such as is suitable for the networked devices.

It should be noted that the link rate is independent of the native stream rates (e.g., the native stream rate of the source device 101). The only requirement is that the link bandwidth of the channel of the data link 311 be higher than the aggregate bandwidth of data stream(s) to be transmitted through that channel. In the described embodiment, the incoming data (such as pixel data in the case of video data) is packed over the respective virtual link based upon a data mapping definition. In this way, the channel 311 (or any of the constituent virtual links) does not, as does conventional interconnects such as DVI, carry one pixel data per link character clock. A further discussion of data rates transmitted through the link is contained in the paragraphs below.

In this way, the system 300 provides a scalable medium for the transport of not only video and graphics data, but also audio and other application data as may be required. In addition, the invention supports hot-plug event detection and can automatically set each channel (or pipe) to its optimum transmission rate.

Thus, a main link (such as treated in 422 of FIG. 4 below) can include one or a plurality of data channels. Each channel capable of simultaneously transmitting multiple isochronous data streams (such as multiple video/graphics streams and multi-channel audio streams. Accordingly, a main link can include a number of different virtual pipes, each capable of transferring isochronous data streams (such as uncompressed graphics/video and audio data) at multiple gigabits per second (Gbps). From a logical viewpoint, therefore, each channel of the main link appears as a single channel with possibly many virtual pipes established. In this way, each data stream is carried in its own logical pipe.

It should be noted that the main link can comprise a plurality of discreet channels and may have adjustable properties. For example, the speed, or transfer rate, of the main link can be adjusted to compensate for link conditions. In one implementation, the speed of each channel of the main link can be adjusted in approximately 0.4 Gbps increments. At maximum throughput, the link can transmit about 2.7 Gbps per channel. Additionally, in one embodiment, the main link can include 1, 2, or 4 main channels. In one example, by setting the number of channels to four, the main link 422 can support WQSXGA (3200×1028 image resolution) with a color depth of 24-bits per pixel at 60 Hz. or QSXGA (2560× 1028) with a color depth of 18-bits per pixel at 60 Hz, without data compression. Even at the lowest rate of 1.62 Gbps per channel, only two channels are required to support an uncompressed HDTV (i.e., 1080i or 720p) data stream.

In addition to providing video and graphics data, display timing information can be embedded in the digital stream providing essentially perfect and instant display alignment. The packet based nature of the inventive interface provides scalability to support multiple, digital data streams such as multiple video/graphics streams and audio streams for multimedia applications. In addition, a universal serial bus (USB) transport for peripheral attachment and display control can be provided without the need for additional cabling.

Figure 4:
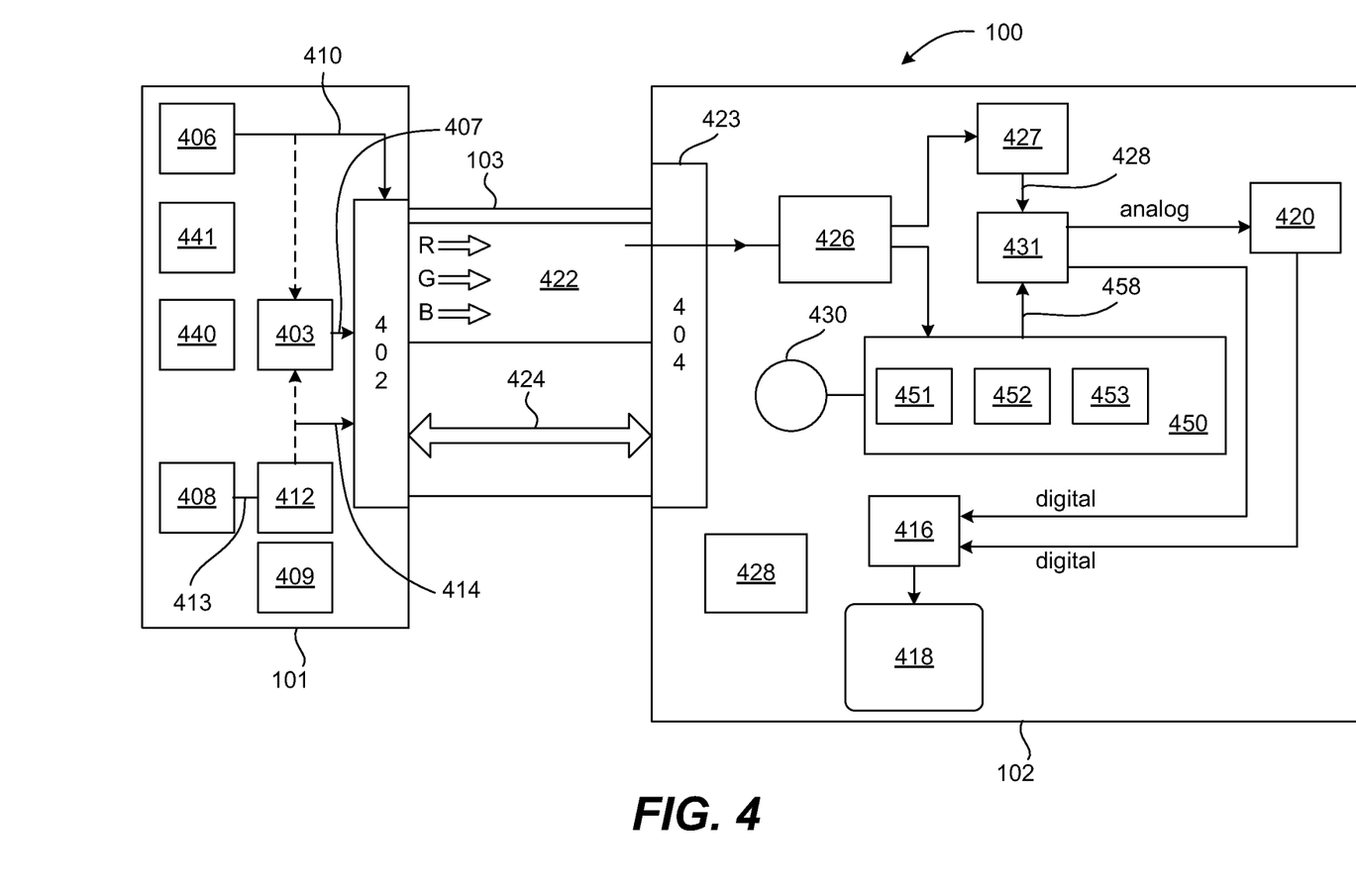
FIG. 4 is a generalized network diagram showing a sink device in communication with a source device via a data link in accordance with the principles of the invention.

The context of embodiments of the invention is further explained with reference to FIG. 4. FIG. 4 is another simplified view of the system 100 shown in FIG. 1 that is used to connect an audio-video source 101 and an audio-video display unit 102. The network source 101 is in communication with network sink 102 via a data link 103 of a type described in FIG. 3 about and explained in greater detail in, for example, in U.S. patent application Ser. No. 10/726,794 entitled "PACKET BASED VIDEO DISPLAY INTERFACE AND METHODS OF USE THEREOF" filed Dec. 2, 2003 and hereby incorporated by reference herein for all purposes.

Referring again to FIG. 4, the source 101 can, for example, include either or both a digital multimedia source 406 and an analog multimedia source 408. In the case of the digital source 406, the content (a digital data stream) 410 is provided to the transmitter 402 which is interfaced with the data link 103. Typically, the transmitter comprises a data interface enabling communication with another network device through the data link 103. In the case of the analog video source 408, an A/D converter unit 412 converts an analog data stream 413 to a corresponding digital data stream 414. Alternatively or additionally, the source 101 can include an encoder 403 arranged to encode the data 410, 414 received from the source 406 or 408. For example, the encoder 403 can convert an eight bit digital data stream 410 (or 414) into a 10 bit data stream 407 in accordance with an ANSI standard 8B/10B encoding scheme. This 8B/10B encoded data is communicated to the sink 102 through the data link 103. As is appreciated by those of ordinary skill said data can be encoding in accord with a number of different schemes. It is also pointed out that the function of encoder 403 can be integrated into convertor 412 which can also receive and encode digital signal 410 in such embodiments. In such case both the converted digital data stream 414 and the digital data stream 410 can be encoded 403, output as an encoded data stream 407. In any case, streams 407, 410, 414 can all be processed similarly by the transmitter 402 and then transmitted through the data link 103.

The source 101 can further include link training circuitry 440 configured to generate link training information associated with the content (e.g., one of 407, 410, 414) to be transmitted to receiving devices. This information can include, but is not limited to clock information, timing information, test and training data patterns, handshake information, and numerous other pieces of information necessary or helpful in configuring a receiver to properly present the content transmitted. Commonly, such configuration and handshaking information is transmitted to a receiving network device via an auxiliary channel 424 of said data link 103. In most cases the configuration (link training) information enables the receiver to reconstruct the audio-video signal.

Additionally, the source 101 can include hot plug detection circuitry 409 configured to receive hot plug detect messages from the receiving network device 102 when it is hot plugged into the network. In one implementation, such hot plug information is transmitted and received via the auxiliary channel 424 of said data link 103. In some embodiments, the hot plug detection circuitry 409 can be equipped with a toggle that can be turned off or on. For example, when the toggle is switched "on", the hot plug detection circuitry detects hot plug events when other devices are connected to the source 101 in hot plug events. In such a situation the source 101 can send link training information along with transmitted data. When the toggle is switched off, the hot plug detection circuitry 409 does not detect hot plug events and therefore sends the audio-video signal without sending associated link training information.

Also, if desired the source 101 can further include a power saving module 441 configured to send power control messages to associated network devices connected with the source. For example, after some preset time period the source can send a message to a sink instructing it to power down some or all of its systems and/or sub-systems to save power until such time as the system has need of it. Many different implementations of this embodiment are contemplated by the inventors. Commonly, such power save information is transmitted to a receiving network device via the auxiliary channel 424 of said data link 103.

In some embodiments, the source 101 can be configured to include a default transmission mode. As a reminder, in one particular embodiment, data can be transmitted through 1, 2, or 4 channels of the main link 422 and generally at a minimum bit rate of about 1.62 Gbps to a maximum of 2.7 Gbps per channel. It should be noted that the source 101 can be configured to transmit network content in a simplified default mode. The default mode involves transmitting data over a single data channel (even when more than one channel is available) and at a lowest available bit rate. For example, the default mode can transmit data through a first data channel ($L_0$) and at a at reduced bit rate (RBR) of 1.62 Gbps. This default mode can be used by a sink device to conduct self-configuration to overcome a lack of link-training information. This is discussed in greater detail below. In any case, in implementations where the default rate is known by the sink device, the default mode significantly reduces the complexity of the self-configuration process and therefore increases the speed of the process.

The content is then transmitted through the data link 103 to the sink device 102 where it received as a stream of audio-video data (an audio-video signal) 423 that can be decoded, displayed, used, or otherwise consumed. In this further description, the sink will be described as a display device (but is expressly not limited to such). The sink device 102 receives the transmitted network content through the sink interface 404 of the data link 103 as a data stream.

Upon the hot plugging of the sink 102, the sink can send a hot plug detect (HPD) message to the source device such that the source 101 becomes aware that a hot plug event has occurred. For example, the HPD message can be sent by HPD messaging circuitry 428 through said auxiliary channel 424 of the link 103. Accordingly, the auxiliary channel can enable a sink 102 to send the HPD message to the source 101 upon connection and power up of the sink device 102. The source 102 receives 409 the hot detect message and responds to it in one of a number of ways described herein.

When an HPD message is received, recognized, and processed at the source, under the correct conditions, the source can acknowledge receipt of the HPD message. Typically, this comes in the form of data messages containing link training information concerning the transmitted audio-video signal which can be transmitted to the sink using the auxiliary channel 424. As will be described herein, under some conditions the sink will not send a HPD message and also under some conditions the source will not receive, detect, or recognize, an HPD signal sent by the sink (such as events $x_1$ and $x_2$ of FIG. 2A). An important aspect of the invention describes how the system deals with these types of events.

To continue, the received audio-video signal 423 can be input into link communication circuitry 426 that determines whether the audio-video signal 423 has associated link training information or is received without the link training information. Where the link training information is provided in association with an audio-video signal, the link training information is processed by circuitry 427 designated for reconstruction of the signal based on source generated link training information. For example, circuitry 427 can include a time base recovery unit that enables the reconstruction of the signal 423 after the circuitry performs a standard link training protocol to configure the sink enable reconstruction of the data steam of the audio-video signal. Such link training protocols are known to persons of ordinary skill in the art.

In the absence of link training information the signal 423 can be reconstructed using characteristics of the received audio-video signal itself and the local clock 430 of device 102. Thus, when audio-video signal 423 is received without associated link training information, the audio-video signal is processed by self-configuration circuitry 450 to reconstruct the data stream of the received audio-video signal.

The self-configuration circuitry 450 works in conjunction with a local clock 430 of the device 102 to enable self-configuration of the device 102 to stabilize and correctly interpret the received data 423. This enables the original signal to be reconstructed from the packetized data stream received from the source 101. This signal 423 is frequency and symbol locked with a local clock 430 (in processes explained in detail below) and then decoded for further processing or display. The frequency and symbol locking is the result of processes which, in one embodiment, are each performed separately by modules 451, 452, and 453. Module 451 may be referred to as an active-channel utilization module or circuitry for determining the number of channels or lanes being used to carry signal 423. Module 452 is frequency setting circuitry for local clock 430 used for setting the local clock frequency to a clock rate synchronized to one of the known link rates. Module 453 is the symbol locking circuitry that identifies symbol boundaries and performs the symbol locking or synchronization.

A relatively fast clock 430 having a stable frequency is required. Typically, the local clock 430 is chosen such that it has a high degree of stability and accuracy and a clock frequency fast enough to match the bit rate of the data transmitted through the link 103 at the highest possible link rate. Clocks having sufficient stability are clocks having a frequency variance of less than about 3%, with clocks having a frequency variance of 1% or less being preferred. Generally, crystal oscillators such as quartz oscillators have the required stability properties to enable the invention. Moreover, a clock having a clock frequency of at least 27 MHz is generally preferred as being sufficient to process 2.7 Gbps link rates. Clock 430 is used together with self-configuration circuitry 450 to generate a signal-based clock frequency for the received data and lock that frequency to the local clock frequency.

However, crystal oscillator based clocks are expensive in several respects and are often not always used, even though they are able to create electrical signals with very precise frequencies. In the marketplace, it is far more common to see ring oscillator clocks, since they are less expensive and easier to implement. They are widely used in semiconductor integrated circuits and are easy to implement into ICs or SOCs (system on chips). However, the accuracy of ring oscillators is not as high as crystal oscillators. The oscillation frequency of a ring oscillator can vary based on various factors such as semiconductor process, temperatures, and voltage. The target frequency (i.e., normal frequency) of a ring oscillator may easily deviate. However, one aspect of link training, as described below, can be used to prevent this deviation from occurring without the use of extraneous devices or cost, thereby enabling clock 430 to be based on a ring oscillator.

As is known in the field of digital receiver and monitor design, normally there is link training that takes place between the source device (DPTX) and the sink or receiver (DPRX). The link has to be configured so that the sink device can receive the signal correctly so that it can be decoded. The first stage of this link training is transmitting a clock from the source, the clock signal referred to as training pattern 1 (TPAT1). This training pattern can be transmitted at a low bit rate of 1.62 Gbps or a high bit rate of 2.7 Gbps. It may be described as a serial clock pattern and has a fixed frequency.

Figure 6:
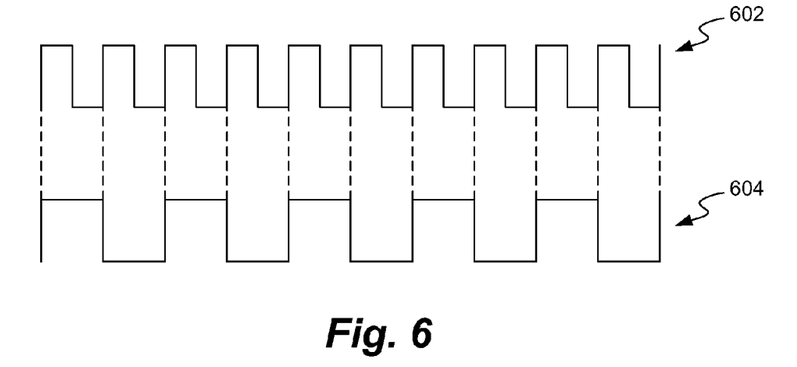
FIG. 6 is a diagram showing a training pattern signal and a fixed frequency clock signal.

Referring now to FIG. 6, a clock 602 and TPAT1 604 corresponding to clock 602 that may be transmitted to the sink device during normal link training are shown. In other embodiments, the source may send other fixed frequency signals to the sink device that can be used in the processes described below in FIGS. 7 to 9 for adjusting the frequency of a ring oscillator. However, in the described embodiment, TPAT1 is used since it provides a known and reliable fixed frequency of 1.35 GHz at a bit rate of 2.7 Gbps. As described below, this fixed frequency signal can be used to adjust the frequency of the ring oscillator clock 430.

A ring oscillator frequency may be adjusted by comparing the incoming TPAT1 signal to an internally generated clock frequency. A fixed frequency incoming signal, such as TPAT1 from a source device (DPTX) is used for adjusting a ring oscillator frequency of a sink device (DPRX). More generally, any clock frequency that is derived from a ring oscillator may be adjusted by comparing an incoming fixed frequency signal to an internally generated clock. A fixed frequency incoming signal from DPTX is used for adjusting any clock frequency that is derived from a ring oscillator.

Figure 7:
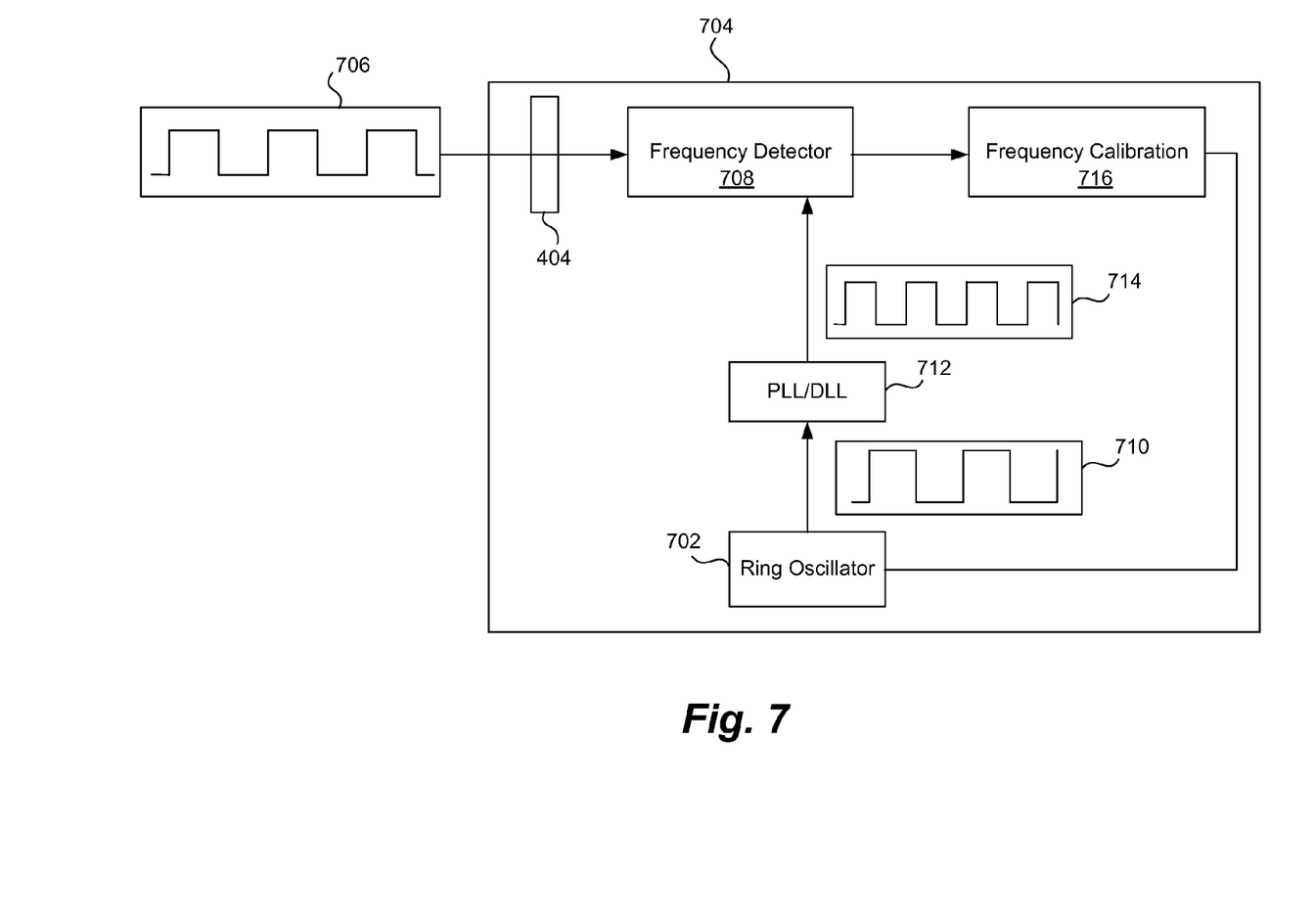
FIG. 7 is a block diagram of an integrated circuit device for automatically synchronizing the frequency of a ring oscillator in a receiver in accordance with one embodiment.

FIG. 7 is a block diagram of an integrated circuit device for implementing one embodiment of the present invention. In another embodiment, the functionality of the IC device may be implemented as a system on a chip (SOC). Clock 430 is based on ring oscillator 702 in receiver 704. An incoming signal 706 is received by device 704 over a main link 103 (not shown in FIG. 7). In one embodiment, signal 706 is transmitted over bi-directional auxiliary channel 424 of link 103. As noted above, this signal 706 is a training pattern clock signal (TPAT1) that is typically sent to a sink device (DPRX) during a link training phase. In other embodiments, it may be another type of fixed frequency signal, such as the second training pattern (TPAT2), which may follow the ANSI 8B/10B standard.

Signal 706 is first received by link interface 404 in receiver 704 and is described above with respect to FIG. 4. It is then processed by a frequency detector 708 which has two inputs, one being signal 706. Another input to frequency detector 708 originates with ring oscillator 702. An initial signal frequency 710 from oscillator 702 is input to a phase-locked loop (PLL) module, referred to as PLL/DLL module 712. As is known in the art, a PLL/DLL module may be used to multiply or divide a clock frequency or other type of frequency. PLL/DLL module 712 creates an internally generated clock frequency 714. This internally generated signal 714 is the second input to frequency detector 708.

Frequency detector 708, also referred to as a phase frequency detector, compares the phase of the two input signals 706 and 714. It has two inputs which correspond to two different input signals. In the described embodiment, one is from ring oscillator 702 via PLL/DLL 712 and the other is from an external source, in this case a source device, DPTX. Frequency detector 708 compares the frequency of the two input signals. Based on this comparison, detector 708 will cause the trimming of internally generated signal 714 until it is within a threshold difference from the incoming signal, which has a fixed, known, and reliable frequency and is received at a known time. Frequency detector 708 has at least one output which instructs a frequency calibration module 716 to calibrate the signal by trimming it using known methods in the art. In other embodiments, ring oscillator 702 may have a trimming control mode operable by a CPU (not shown). If the difference between the two signals is below the threshold difference, frequency detector 708 does not send instructions to calibrate and trim the target frequency from the ring oscillator.

Figure 8:
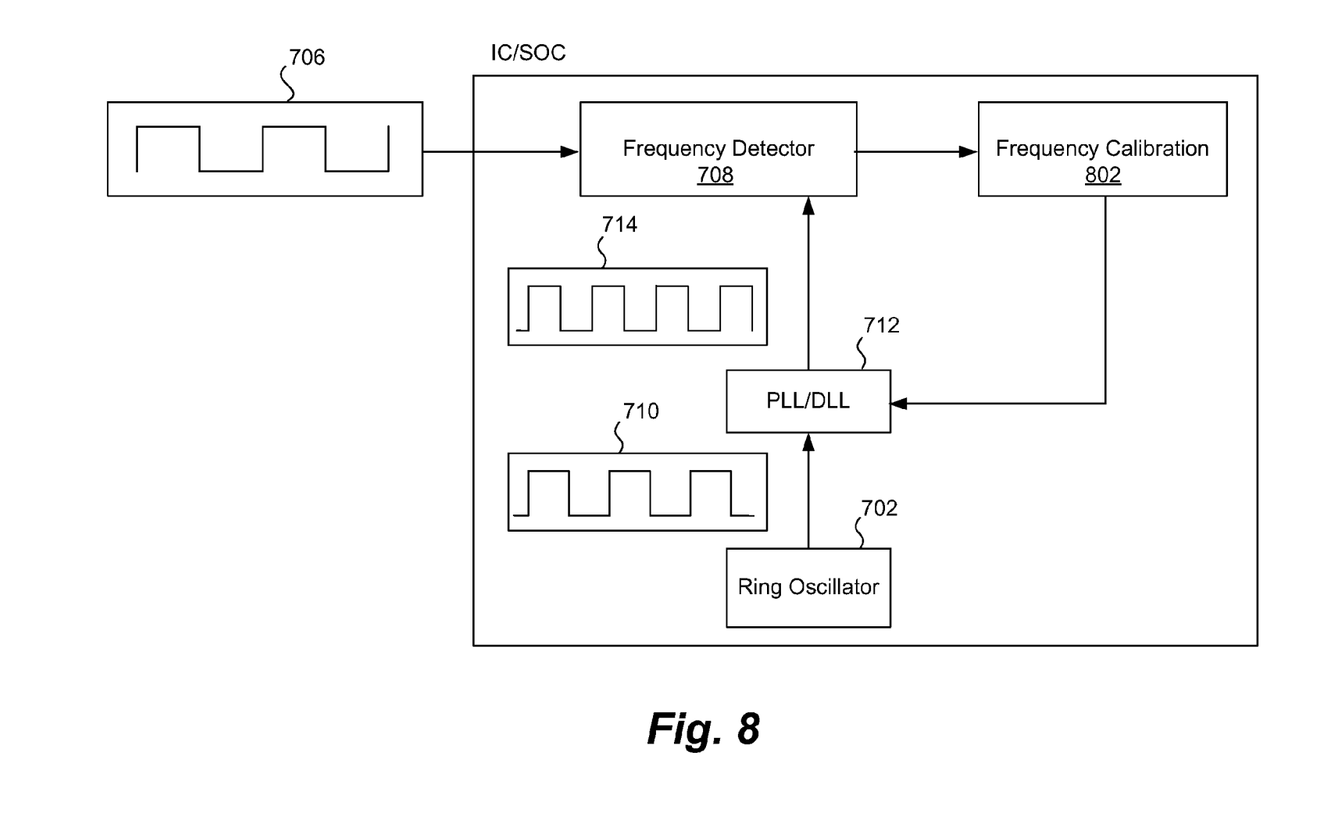
FIG. 8 is a block diagram of an integrated circuit device for automatically synchronizing the frequency of a ring oscillator in a receiver in accordance with another embodiment.

In another embodiment, shown in FIG. 8, the output from frequency calibration module 802 is transmitted directly to the PLL/DLL module 712 (the frequency calibration module in this embodiment is different from the one in FIG. 7 because of where it is sending its instructions). When the PLL/DLL module 712 receives the instructions, it will either multiply, divide, or perform another operation on the signal to bring it closer to the incoming reference signal 706. In this embodiment, the frequency of the ring oscillator is not trimmed, so the target frequency stays the same, but rather the internally generated signal is modified by PLL/DLL 712 based on instructions from frequency calibration module 802.

Figure 9:
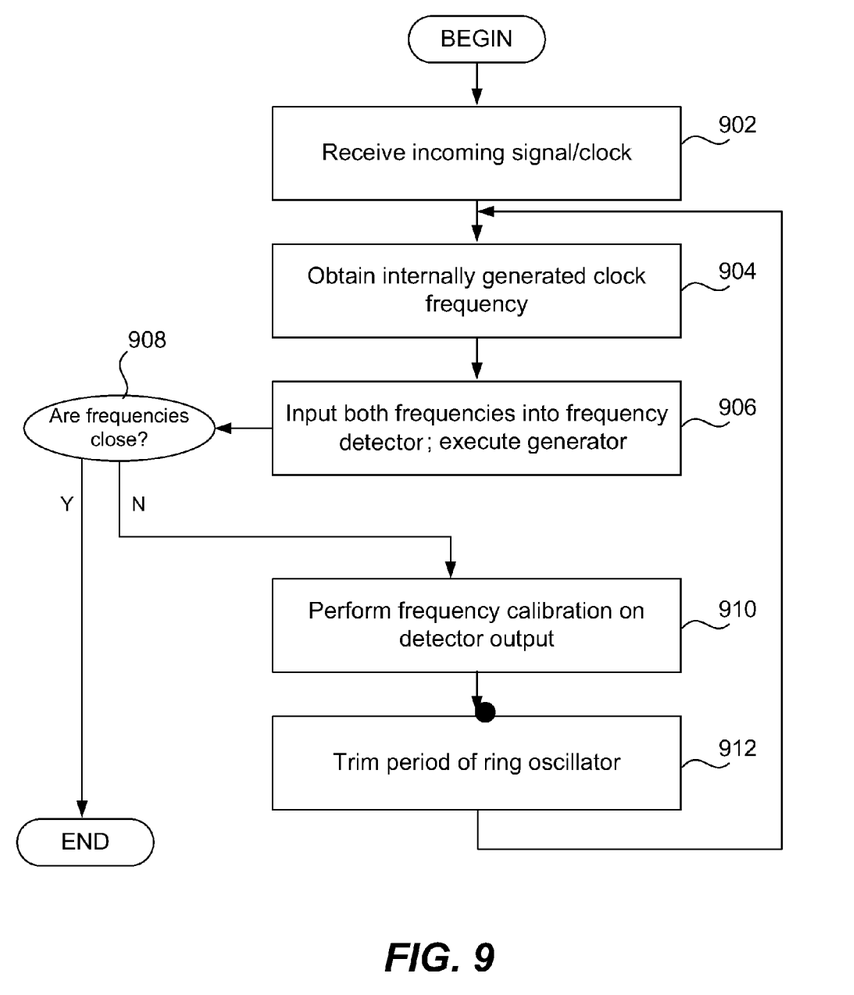
FIG. 9 is a flow diagram of a process of adjusting the frequency of a ring oscillator using an incoming reference signal in the context of a receiver in accordance with one embodiment.

FIG. 9 is a flow diagram of a process of adjusting the frequency of a ring oscillator using an incoming reference signal in the context of a DPRX interface in accordance with one embodiment. At step 902 the sink device, receives an incoming signal/clock. As described above in FIG. 6, this may be TPAT1, a clock signal from the source (DPTX), for link training. In one example, this frequency may be 1.35 GHz, which is known to the sink. The time at which it will be received is also known to the sink device, i.e., during the first stage of link training. It is received via main link 103 and more specifically, via auxiliary channel 424. As is known in the art, TPAT1 is sent during link training to provide clock data to the sink device as the first step in enabling the sink to receive the video data signal (or different type of multimedia signal) properly so that it can decode and display it.

At step 904 the sink device obtains an internally generated clock frequency. As described above, this is obtained from a ring oscillator creating a signal having a target frequency, for example, 27 MHz. This signal is input to a PLL/DLL which performs operations on the signal, as are known in the art, and produces an internally generated clock signal. At step 906 the internally generated signal and the incoming, external signal (TPAT1) are input to a frequency detector. The frequency detector executes and performs a comparison of the two frequencies. At step 908 the difference in the frequencies is examined to see if the two frequencies are sufficiently similar. For example, if the difference between the two frequencies is greater than 1% of the incoming signal 706, then the process is complete. The designer or manufacturer of the sink device may determine how close the two frequencies need to be, i.e., how accurate the ring oscillator needs to be. It may decide that if the two frequencies are within 3% of one of the signals, the ring oscillator does not need to be further adjusted. In other embodiments, specific ranges may be used. In yet another embodiment, the PLL/DLL need not be given further instructions for modifying the target frequency from the ring oscillator.

However, if the difference between the two signals is greater than a specific threshold amount, control goes to step 910, where, in one embodiment, the frequency or the period of the ring oscillator is calibrated and trimmed by a specific amount. Once the period of the ring oscillator has been trimmed, a new target frequency is created, one that is closer to the frequency of the incoming signal, and control returns to step 904 where a new internally generated clock frequency is created from the adjusted target frequency. Using the example from above, this may be repeated until the internally generated frequency is close to 1.35 GHz or very close to it. Thus, adjusting of the ring oscillator continues, thereby ensuring that the ring oscillator is calibrated correctly using the TPAT1 signal. In this manner, the accuracy of the ring oscillator frequency can be compensated to the extent that it can be used in the receiver context and can achieve a higher degree of accuracy.

In another embodiment, after the frequency detector has determined the difference in frequency of the incoming signal and the ring oscillator, instead of trimming the period of the oscillator, the sink device sends a request to the source, using main link 103 to adjust the bit rate of TPAT1 or other signal until the two frequencies (the incoming frequency and the internally generated frequency) are sufficiently close. Here, it is clear that the goal is to get the frequency of the ring oscillator and the incoming signal to be the same or very close without having to trim the ring oscillator or adjust parameters in the PLL/DLL. In other words, here the DPTX is requested to adjust itself to accommodate the DPRX clock. In other embodiments, a combination of the various methods may be used. For example, a request may be sent to the DPTX from the frequency detector in the DPRX while also sending instructions to a frequency calibration module to either perform trimming on the ring oscillator or to instruct the PLL/DLL. This may be useful in cases where link 103 between DPTX and DPRX is unavailable.

As described in greater detail below, components described in FIGS. 7 and 8 can be implemented in an integrated circuit package or as a system on a chip, where the frequency detector, calibration module, ring oscillator, and PLL/DLL are implemented as individual circuitry, chips, or components. In other embodiments, some of the functionality may be implemented in software or firmware. For example, the logic performed after the comparison is made of the two frequencies by the frequency detector to determine whether the two are close or still too different and what action to take may be implemented using software or firmware in the frequency detector or in a separate software module.

In this manner, an electrical signal with a precise frequency originating from a ring oscillator is enabled and is done so without having to use non-volatile memory. For example, a ring oscillator frequency may be compensated for each IC or SOC at the end of the semiconductor process by trimming to get the desired frequency. However, the result (after trimming) needs to be saved in non-volatile memory, such as NVRAM, EEPROM, Flash, or OTP, for each IC/SOC and the memory should be on the chip or system (PCB), thereby increasing the cost and testing time (for trimming and storing the trimmed value). However, using the methods and circuitry described above in FIGS. 7 to 9, even if the frequency varies from the target frequency because of temperature, process variation, or voltage dependency, it can be adjusted back to the target frequency using TPAT1 or other known, reliable, fixed frequency signal. And this can be done without the use of non-volatile memory or the time needed to store and retrieve trimmed values.

Returning now to FIG. 4 and the reconstructed data stream in the absence of link training data, the reconstructed signals (either 428 or 458) are then processed by a decoder 431 to decode the received signal and convert to any desired format. Typically, said decoding involves a conversion to a format displayable by display 418. In one particular embodiment, the decoder 431 receives network content 423 from the main link 422 encoded on an 8B/10B format. The 10-bit symbols are decoded and converted back to native 8 bit signals and then forwarded for further processing or display 418. In the case of digital content, the decoded data stream is forwarded to display interface 416 where it is configured for display by display media 418. Additionally, where required, the decoded data stream is forwarded to digital to analog convertor 420 where it is reconfigured as an analog signal and then forwarded to display interface 416 where it is configured for display by display media 418. Although not required, in some embodiments, the display media 418 is an integral component of the sink device 102.

As indicated above, an important aspect of the invention is directed to methods and systems enabling the data to be displayed at the sink in the absence of link configuration information. Referring now to the flow diagram of FIG. 5 and system diagram FIG. 4, an embodiment of a method of communicating audio-video data between devices in a multimedia network is disclosed.

Figure 5:
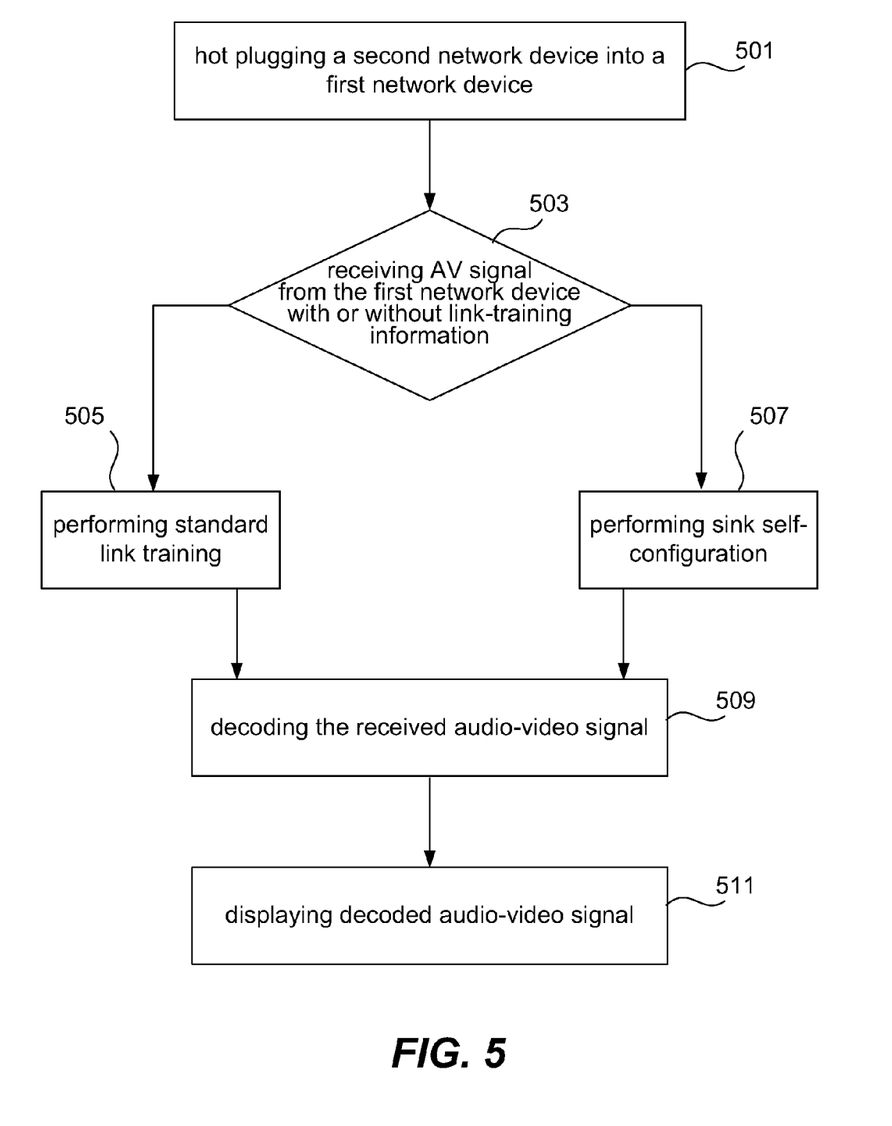
FIG. 5 is a flow diagram illustrating one approach to handling hot plug events in a multi-media network in accordance with the principles of the invention.

The process is briefly described as follows. A suitable process begins with an operation of hot plugging a second device into an active first network device via a data link (Step 501). Such a hot plug event is as described previously. For example a powered sink device 102 (e.g., a display device) is plugged into a powered source device 101 (e.g., a computer device). In an alternative example, said devices are already connected and unpowered sink device 102 switched on (e.g., at time $t_1$).

In response to the hot plug event, the second network device 102 (e.g., a sink) provides a hot plug detect message (HPD message) to the first network device (e.g., the source). In the architecture described herein, such an HPD message is sent from sink 102 to source 101 through a bi-directional auxiliary channel 424 of the data link 103. Also, it should be pointed out that some embodiments of the network devices 101, 102 can be configured with a hot plug messaging toggle 428 on the receiver 102 (or alternatively the HPD (See, FIG. 4) that can be switched to an on or off position. The off position indicating that no HPD messages are sent by the device until the toggle is switched into the on configuration which allows HPD messaging. Also, the inventors contemplate network devices 102 that do not have HPD messaging capability at all. In the absence of such capability or in a toggle "off" configuration the sink device 102 does not send HPD messages. When the sink 102 is configured appropriately, the device will send at least one HPD message in response to the hot plug event. As an aside, the inventors point out that the hot plug detection circuitry 409 can also be toggled to selectively receive HPD messages or not.

The process embodiment disclosed herein can accommodate both devices that do, or do not, send HPD messages. The next operation is one of receiving network content at said second network device after the hot plug event (Step 503). Thus, the source 101 sends network content whether or not a HPD message is sent by the sink 102 or not. Moreover, the source 101 sends network content whether or not the source 101 receives and recognizes the HPD message.

An important attribute of the invention is that the source sends the data in one of a finite number of configurations. To begin, the embodiment sends data at one of two link rates comprising known bit rates. For example, the data link rates are either a reduced bit rate (RBR) of 1.62 Gbps or at a high bit rate of 2.7 Gbps. Thus, the data is sent at one of a finite number of bit rates. Here, we have two standardized bit rates.

Also, the data is sent over a finite number of channels, 1, 2, or 4 channels. Thus, in the foregoing circumstance, the data is received in one of six possible modes (two different bit rates over three possible channel combinations). Of course the number of bit rates and channel combinations can be adjusted to accommodate different or improved technologies, but the basic idea is that a finite number of channel and bit rate combinations are used to transmit the data stream in one of a finite number of transmission modes. In one embodiment, the data is sent in a serial data stream compliant with the Serial Advanced Technology Attachment standard (SATA) in accordance with the specifications set forth by the SATA-IO.

Additionally, the invention contemplates a "default" data transmission mode for the source described above. In particular, the default mode can be very useful as a mode of operation for networks having more primitive receivers. Thus, when a source device does not receive and recognize HPD messages from a sink device it sends data in a default mode. In one particular default mode, the data is sent a RBR (1.62 Gbps) through a single data channel. Accordingly, the data is received at the sink device $102$ in a SATA data stream through one channel (for example a default first channel $L_0$) at the lowest available bit rate. Under such conditions, the receiving device will have little difficulty in handling the signal. However, in a more general case, the data is transmitted in one of a small number of finite transmission modes. In this embodiment, at one or two different link rates (1.62 Gbps or 2.7 Gbps) over 1, 2, or 4 channels.

The source device can respond differently to the received data depending on whether associated link training information is also provided. Whether said link training information is provided can depend on a number of factors. For example, when or if the HPD message is received at the source or what toggle configuration is being used. For event $x_0$ the standard VBIOS start up routine can institute a link training that will enable the device $102$ to receive and symbol and frequency lock the data with the display local clock, and display the data based on transmitted link training information from the source. For event $x_3$ the operating system in conjunction with the appropriate device drivers can institute a link training that will enable the device $102$ to receive, symbol and frequency lock the data with the display local clock, and display the data also based on transmitted link training information from the source. In response to events $x_1$ and $x_2$, a somewhat different approach may be taken.

Referring to the condition described in FIG. 2A at event $x_1$ a hot plug event occurs prior to operating system booting begins (prior to $t_2$). Accordingly, the VBIOS operates to deal with link state changes and interrupts. Importantly, during the period $201$ the source $101$ does recognize HPD messages and so cannot provide link training information as required to conduct standard configuration of the sink $102$. Thus, multimedia data sent by source $101$ arrives at sink $102$ but because the sink has not be properly configured it arrives without being provided the associated link training information. Therefore the sink $102$ is not configured to display the content. The same can be said for a event $x_2$ type event.

At this point one of two actions are taken. The sink device $101$ has received, depending on the source device $102$ response to the hot plug event, either (i) link training information AND network content from the source device $101$ or (ii) network content from the source device $101$, WITHOUT said link training information. As to instance (i), most typically, such events occur before $t_1$ and after $t_3$ (of FIG. 2A). Commonly, in such conditions the source $101$ is capable of receiving, recognizing, and responding to HPD messages from the sink $102$. In accordance, the source provides link training information to the source that can be used to configure the sink and data link to receive data. This leads to standard link training (Step $505$). Alternatively, in instance (ii), the sink device $102$ receives the network content without said link training information. This can be due to a variety of different conditions but can occur when the source $101$ is unable to receive and recognize HPD messages sent by the sink after a hot plug event and no acknowledgment or handshaking occurs with the sink. This signals to the sink $101$ that local self training should be performed (Step $507$). Type (ii) instances generally occur when hot plug events (in this case events $x_1$, $x_2$ of FIG. 2A) occur prior to OS set up (in time periods $201$, $202$, prior to $t_3$) or when the source fails to send link training information for other reasons. Because during this time period, the source does not handle interrupt events (such as hot plug events) well.

In Step $505$, the sink device selectively performs device configuration based on the information received in the preceding step. In the case (i) where link training information is provided to the sink $102$ by the source, the sink uses this information perform link configuration. In ordinary link training, the link training information is transmitted to the sink via the auxiliary line $424$. This link training information can include information including, but not limited to, number of channels operational and transmitting data, symbol boundary information, timing information, link rates, test patterns used to stabilize the link as well as other information. Any one of a number of link training processes can be used to operate upon this information to provide a stable and accurate data link. A particular methodology that may be used is that set forth in U.S. patent application Ser. No. 10/726,794 entitled "PACKET BASED VIDEO DISPLAY INTERFACE AND METHODS OF USE THEREOF" filed Dec. 2, 2003.

Returning to FIG. $5$, the data stream is now decoded by the sink device $102$ (Step $509$). This can be decoded in accordance with a number of schemes. The 8B/10B signal can be converted back to 8-bit signal, the data stream can be converted to an analog signal, and many other decoding processes. For example the modules $431$, $420$, and/$416$ of the receiver $102$ can be used to decode the signal for input into a display $418$. Once decoded the signal can then be forwarded for further processing or displayed using a display media (CRT, LED monitor, LCD monitor, etc.) (Step $511$).

In addition, embodiments of the present invention further relate to integrated circuits and chips (including system on a chip (SOC)) and/or chip sets or packages. By way of example, each of the devices described herein may include an integrated circuit chip or SOC for use in implementing the described embodiments and similar embodiments. Embodiments may also relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor. In addition to chips, chip systems, and chip sets, the invention can be embodied as firmware written to said chips and suitable for performing the processes just described.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of adjusting a ring oscillator in a receiver, the method comprising:
    receiving an incoming signal having a known frequency;
    creating an internally generated clock signal having an internal frequency, wherein the internally generated clock signal is the output of a phase-locked loop (PLL) module that receives as an input the output of the ring oscillator;
    inputting the incoming signal and the internally generated clock signal into a frequency detector, thereby creating a detector output;
    determining whether the internal frequency of the internally generated clock signal is within a threshold difference of the known frequency of the incoming signal; and
    trimming a period of the ring oscillator based on the detector output to adjust the internal frequency to be closer to the known frequency of the incoming signal only if the detector output indicates that the difference between the known frequency and the internal frequency exceeds the threshold difference.

2. The method as recited in claim 1 further comprising:
    comparing the internal frequency and the known frequency.

3. The method as recited in claim 1 wherein the incoming signal is a link training signal conveying a clock from a transmitter and is used for link training between the transmitter and the receiver.

4. The method as recited in claim 1 further comprising:
    communicating a request to a source device to adjust a bit rate of the incoming signal, wherein the request is created based on the detector output.

5. The method as recited in claim 4 further comprising:
    continuing to make the request until the internal frequency is within a threshold difference of the incoming signal.

6. An integrated circuit device for adjusting the frequency of a ring oscillator, the device comprising:
    the ring oscillator configured to generate a signal having a target frequency;
    phase-locked loop circuitry configured to perform operations on the target frequency;
    frequency detection circuitry configured to accept a link training signal and an internally generated clock signal as input and to compare the training signal with the clock signal; and
    frequency calibration circuitry configured to trim a period of the ring oscillator based on an output from the frequency detection circuitry only if the output indicates that a frequency difference between the link training signal and the internally generated clock signal exceeds a threshold difference, wherein an output of the phase-locked loop circuitry is the internally generated clock signal.

7. The integrated circuit device as recited in claim 6 further comprising:
    a request generation module for creating a request to a transmitter to adjust the link training signal.

8. The integrated circuit device as recited in claim 6 wherein the frequency detection circuitry further comprises:
    signal comparison circuitry for determining whether the frequency difference between the link training signal and the internally generated clock signal is greater than the threshold difference.

9. The integrated circuit device as recited in claim 6 further comprising clock circuitry based on the ring oscillator.

10. A non-transitory computer-readable medium containing computer instructions for adjusting a ring oscillator in a receiver, the computer instructions comprising:
    instructions for receiving an incoming signal having a known frequency;
    instructions for creating an internally generated clock signal having an internal frequency, wherein the internally generated clock signal is the output of a phase-locked loop (PLL) module that receives as an input the output of the ring oscillator;
    instructions for inputting the incoming signal and the internally generated clock signal into a frequency detector, thereby creating a detector output;
    instructions for determining whether the internal frequency of the internally generated clock signal is within a threshold difference of the known frequency of the incoming signal; and
    instructions for trimming a period of the ring oscillator based on the detector output to adjust the internal frequency to be closer to the known frequency of the incoming signal only if the detector output indicates that the difference between the known frequency and the internal frequency exceeds the threshold difference.

11. The non-transitory computer-readable medium as recited in claim 10, wherein computer instructions for creating an internally generated clock signal further comprises:
    instructions for inputting a target signal having a target frequency of the ring oscillator into the phase-locked loop (PLL) module.

12. The non-transitory computer-readable medium as recited in claim 10, the computer instructions further comprising:
    instructions for comparing the internal frequency and the known frequency.

13. The non-transitory computer-readable medium as recited in claim 10, the computer instructions further comprising:
    instructions for communicating a request to a source device to adjust a bit rate of the incoming signal, wherein the request is created based on the detector output.

* * * * *